(12) United States Patent
Alkhazraji

(10) Patent No.: US 12,065,357 B2
(45) Date of Patent: Aug. 20, 2024

(54) PROCESS FOR MANUFACTURING A PURE POROUS 3D DIAMOND

(71) Applicant: Saeed Alhassan Alkhazraji, Abu Dhabi (AE)

(72) Inventor: Saeed Alhassan Alkhazraji, Abu Dhabi (AE)

( * ) Notice: Subject to any disclaimer, the term of this patent is extended or adjusted under 35 U.S.C. 154(b) by 121 days.

(21) Appl. No.: 17/398,509

(22) Filed: Aug. 10, 2021

(65) Prior Publication Data

US 2021/0363016 A1 Nov. 25, 2021

Related U.S. Application Data

(63) Continuation-in-part of application No. 15/018,928, filed on Feb. 9, 2016, now abandoned.

(60) Provisional application No. 62/113,549, filed on Feb. 9, 2015.

(51) Int. Cl.
| | |
|---|---|
| *C23C 16/27* | (2006.01) |
| *C01B 32/26* | (2017.01) |
| *C01B 32/28* | (2017.01) |
| *C23C 16/04* | (2006.01) |
| *C23C 16/56* | (2006.01) |

(52) U.S. Cl.
CPC .............. *C01B 32/26* (2017.08); *C01B 32/28* (2017.08); *C23C 16/045* (2013.01); *C23C 16/271* (2013.01); *C23C 16/56* (2013.01); *C01P 2002/30* (2013.01)

(58) Field of Classification Search
CPC ...... C23C 16/27; C23C 16/271; C01B 32/336
See application file for complete search history.

(56) References Cited

U.S. PATENT DOCUMENTS

| | | | | |
|---|---|---|---|---|
| 5,314,652 A * | 5/1994 | Simpson | ............. | C23C 16/0254 427/249.14 |
| 5,336,368 A | 8/1994 | Iacovangelo | | |
| 5,443,032 A * | 8/1995 | Vichr | ...................... | C30B 29/40 423/446 |
| 5,869,133 A * | 2/1999 | Anthony | ................. | C23C 16/27 216/10 |
| 5,885,541 A | 3/1999 | Bates | | |
| 5,907,189 A * | 5/1999 | Mertol | ................... | H01L 23/367 257/796 |
| 5,935,323 A | 8/1999 | Tanga | | |
| 6,511,700 B1 * | 1/2003 | Airoldi | ..................... | A61C 3/02 427/249.11 |
| 6,641,861 B2 * | 11/2003 | Saito | ................... | H01L 23/3736 257/E23.044 |
| 7,147,810 B2 * | 12/2006 | Reinhard | ................ | C23C 16/01 156/60 |
| 10,253,426 B2 * | 4/2019 | Noguchi | ............... | C30B 25/186 |
| 10,494,713 B2 * | 12/2019 | Xu | ........................ | C23C 16/274 |
| 2005/0062389 A1 | 3/2005 | Davidson et al. | | |
| 2006/0001029 A1 | 1/2006 | Hayashi et al. | | |
| 2006/0157285 A1 * | 7/2006 | Cannon | ................... | E21B 10/36 175/434 |
| 2008/0241413 A1 * | 10/2008 | Ravi | ...................... | C23C 16/46 118/723 R |
| 2010/0297391 A1 | 11/2010 | Kley et al. | | |
| 2012/0051996 A1 * | 3/2012 | Scarsbrook | ............ | B82Y 10/00 117/88 |
| 2012/0288698 A1 * | 11/2012 | Moldovan | ........... | H01L 23/3732 428/141 |
| 2015/0054000 A1 * | 2/2015 | Shintani | .............. | H01L 21/3065 438/105 |
| 2015/0259790 A1 * | 9/2015 | Newman | ................ | B01J 19/088 118/712 |

FOREIGN PATENT DOCUMENTS

| | | | | |
|---|---|---|---|---|
| BR | 200901543 A2 * | 4/2009 | ............. | C23C 16/27 |
| JP | 2008-74690 * | 4/2008 | ............. | C01B 31/06 |
| JP | 2010097914 A | 4/2010 | | |
| WO | WO 2011/124568 A1 * | 10/2011 | ............. | C23C 16/27 |

OTHER PUBLICATIONS

Lu, W.Z., et al., "Stress in Freestanding CVD Diamond Thick Film". Key Engineering Materials, vols. 426-427, 2010, pp. 564-567.*
Liu, Tao, et al., "Microtexture and Grain Boundaries in Freestanding CVD Diamond Films: Growth and Twinning Mechanisms". Advanced Functional Materials, 2009, 19, 3880-3891.*
Bogdan, G., et al., "Freestanding (100) homoepitaxial CVD diamond". Diamond & Related Materials 15 (2006) 508-512.*
Davies, A.R., et al., "The strength of free-standing CVD diamond". Wear, vol. 256, Issues 1-2, Jan. 2004, pp. 153-158.*
Shu, G., et al., "Growth of three-dimensional diamond mosaics by microwave plasma-assisted chemical vapor deposition". CrystEngComm, 2018, 20, 198-203.*

* cited by examiner

*Primary Examiner* — Bret P Chen
(74) *Attorney, Agent, or Firm* — Hayes Soloway P.C.

(57) ABSTRACT

A process for manufacturing a porous diamond having a tridimensional (3D) structure. The process comprises the steps of using a substrate with a pre-defined shape and a plurality of pores of a defined porosity shape and size, heating a reactant hydrocarbon gas and reactant hydrogen in a filament to form a product gas, depositing an activated carbon atom from the product gas onto the substrate, wherein the activated carbon atom reacts with the substrate to form a diamond structure on the substrate, and completely removing the substrate to obtain the 3D pure porous diamond structure, wherein the 3D pure porous diamond structure is formed entirely of diamond and is identical in shape and porosity shape and size of the plurality of pores as that of the substrate. The 3D pure porous diamond structure formed is of a controlled thickness and porosity, and devoid of the substrate.

16 Claims, 3 Drawing Sheets

PROCESS FOR MANUFACTURING A PURE POROUS 3D DIAMOND

CROSS-REFERENCE TO RELATED APPLICATIONS AND PRIORITY

This patent application is a Continuation-in-Part of U.S. patent application Ser. No. 15/018,928 filed Feb. 9, 2016, which claims priority from U.S. Provisional Patent Application No. 62/113,549 filed Feb. 9, 2015. Each of these patent applications are herein incorporated by reference in their entirety.

FIELD OF THE INVENTION

The present invention relates to a process of manufacturing a synthetic diamond, and more particularly to a process of manufacturing a pure solid-state three-dimensional (3D) porous diamond structure.

BACKGROUND OF THE INVENTION

Background description includes information that may be useful in understanding the present invention. It is not an admission that any of the information provided herein is prior art or relevant to the presently claimed invention, or that any publication specifically or implicitly referenced is prior art.

Diamond has been one of the most fascinating allotropes of elemental carbon. Synthetic diamond has attracted great deal of attention because it can be fabricated at a relatively low cost with good control over morphology and size. A recent advancement in the field is the process of making a porous diamond through a high temperature and high pressure route using porous carbon as a precursor. However, a major disadvantage of producing diamond aerogels is that the resultant porous diamond is a composite of nanosize only, which is basically in powder form. Also, the manufactured product is a composite of diamond and other materials used as a substrate during the manufacturing process. Therefore, this method is not suitable for producing larger sized monoliths of pure diamonds.

Moreover, in order to produce a porous diamond of larger dimensions (a few centimeters and above), and in particular a 3D structure porous diamond, a chemical vapor deposition or a plasma deposition method can be a suitable option. However, a standalone, large size, porous diamond has never been fabricated in the past. Moreover, the final 3D porous diamond has never been disclosed without a substrate.

Therefore, there exists a need for a solution for overcoming the above listed drawbacks and for manufacturing a pure porous diamond of larger sizes.

SUMMARY OF THE INVENTION

Therefore it is an objective of the present invention to propose a method of manufacturing a pure porous diamond, which overcomes the drawbacks associated with traditionally employed manufacturing methods. The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

In an aspect of the invention, a process of manufacturing a tridimensional (3D) pure porous diamond structure, the process comprising the steps of using a substrate with a pre-defined shape and a plurality of pores of a defined porosity shape and size, heating a reactant hydrocarbon gas and reactant hydrogen in a filament, wherein the reactant hydrocarbon gas and reactant hydrogen react to form a product gas, depositing an activated carbon atom from the product gas onto the substrate, wherein the activated carbon atom reacts with the substrate to form a diamond structure on the substrate, removing the substrate to obtain the 3D pure porous diamond structure, wherein the 3D pure porous diamond structure is formed entirely of diamond and is identical in shape and porosity shape and size of the plurality of pores as that of the substrate.

In an embodiment of the present invention, the reactant hydrocarbon gas is methane ($CH_4$).

In another embodiment of the present invention, the reactant hydrocarbon gas is acetylene ($C_2H_2$).

In another embodiment of the present invention, the 3D pure porous diamond structure comprises two levels of porosity, a first level of pores formed by replicating the plurality of pores of the substrate, and a second level of pores or gaps formed owing to removal of the substrate from the deposited diamond structure.

In another embodiment of the present invention, deposition of the activated carbon atom is done on the substrate such that the plurality of pores present on the substrate are not filled up with diamond depositions, thereby allowing the 3D pure porous diamond structure formed to have a same shape, size and number of pores as that of the substrate.

In another embodiment of the present invention, diamond deposition is avoided to occur at least one corner of the substrate, for allowing the substrate to be removed via the at least one corner.

In another embodiment of the present invention, the substrate is removed via the plurality of pores formed in the 3D pure porous diamond structure.

In another embodiment of the present invention, the activated carbon atom is deposited on the substrate using chemical vapor deposition (CVD).

In another embodiment of the present invention, the substrate is made of a metallic or non-metallic material.

In another embodiment of the present invention, the substrate material is selected from a group consisting of silicon, molybdenum, tungsten, titanium, silicon carbide, beryllium oxide, nickel, platinum, cobalt, iridium or iron.

In another embodiment of the present invention, the substrate is removed using thermal decomposition, oxidative decomposition, acidic etching or basic etching.

In another embodiment of the present invention, the substrate is removed by immersing the diamond structure on the substrate into a chemical solution for at least 2 hours at room temperature (27° C.). In another embodiment of the present invention, the chemical solution is an aqueous acidic solution.

In another embodiment of the present invention, the aqueous acidic solution is hydrogen chloride solution or sulphuric acid solution.

In another embodiment of the present invention, a concentration of the aqueous acidic solution is 1 to 10M.

In another embodiment of the present invention, the process further comprises a step of repeatedly washing the 3D pure porous diamond structure in water to remove excess chemical solution and/or substrate residue.

In another embodiment of the present invention, the 3D pure porous diamond structure formed is of a controlled thickness and porosity, and devoid of the substrate.

BRIEF DESCRIPTION OF THE DRAWINGS

The subject matter that is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

Figure 2A:
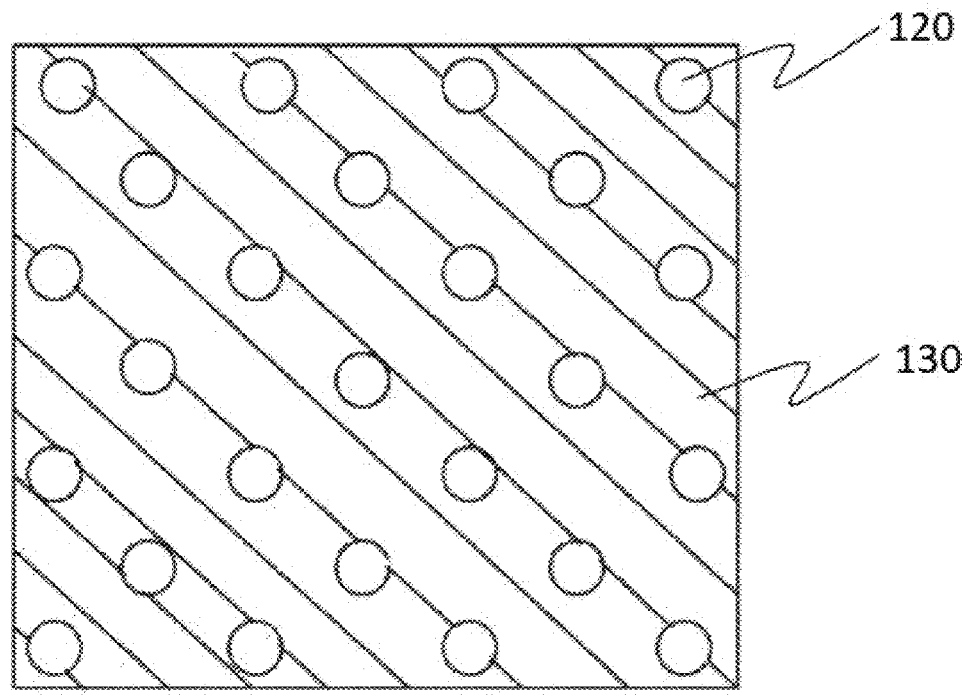
FIGS. 2A and 2B illustrate a plan view and a cross-section view of a portion of a pure diamond material after removal of the substrate, in accordance with an embodiment of the present invention.
Figure 2B:
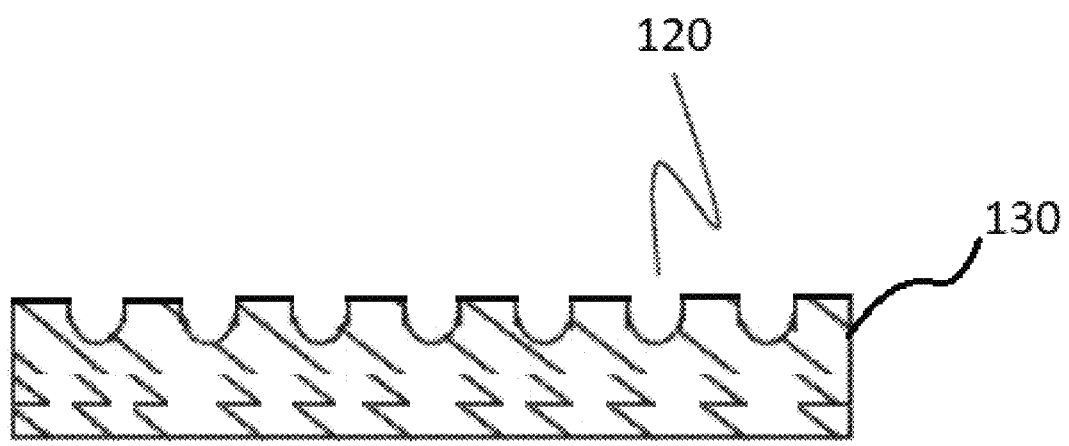
Figure 3:
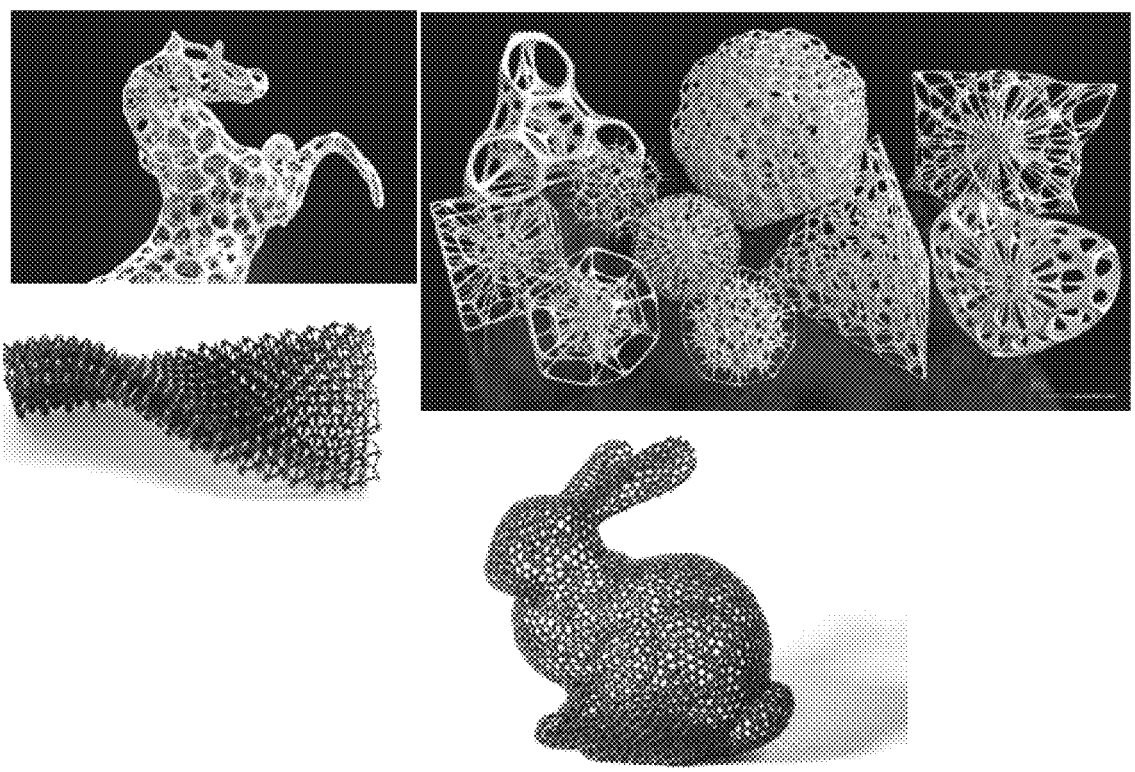
FIG. 3 shows a number of various substrates used for obtaining diamond structures of the same shape, size and pores as that of the substrates used.

The aspects of a method of manufacturing a pure porous diamond, according to the present invention will be described in conjunction with FIGS. 1-3. In the Detailed Description, reference is made to the accompanying figures, which form a part hereof, and in which is shown by way of illustration specific embodiments in which the invention may be practiced. It is to be understood that other embodiments may be utilized and logical changes may be made without departing from the scope of the present invention. The following detailed description, therefore, is not to be taken in a limiting sense, and the scope of the present invention is defined by the appended claims.

Figure 1A:
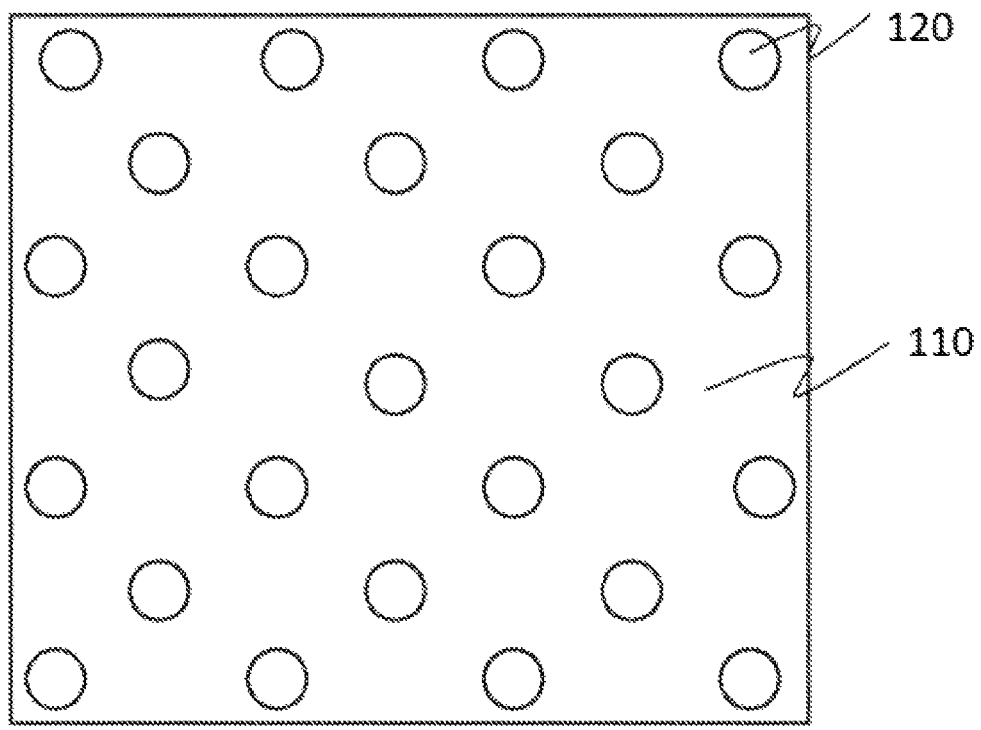
FIGS. 1A and 1b illustrates a plan view and cross section, respectively of a substrate to be used for deposition and growth of diamond, in accordance with an embodiment of the present invention.
Figure 1B:
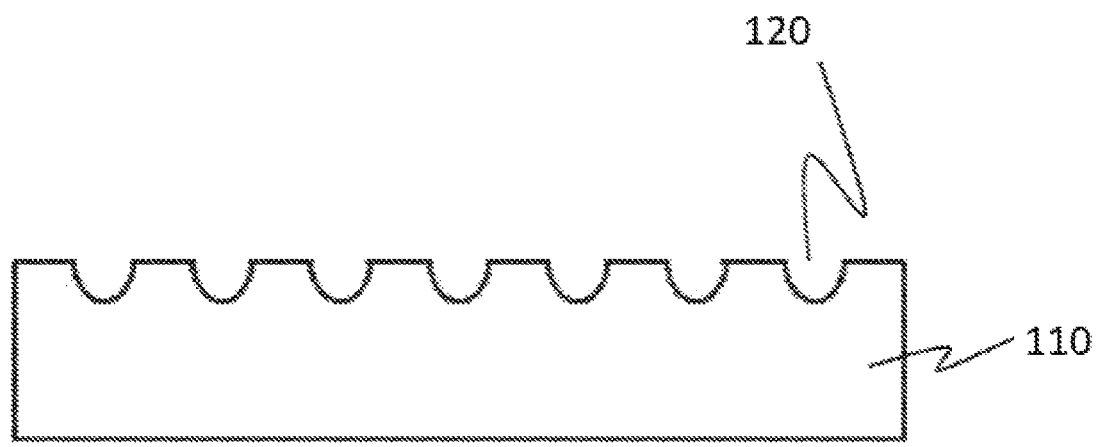

The present method proposes the fabrication of a pure and porous synthetic diamond with controlled porosity, chemistry and consequently physical properties through a two-step process. As illustrated in FIG. 1A and FIG. 1B, a substrate 100 having a base 110 with specific porosity or a plurality of pores or recesses 120 is used to deposit and grow diamond films with a controlled thickness. The substrate base 110 can have any shape, geometry or size depending on a desired final structure of the diamond needed to be manufactured. Examples of various types of three-dimensional (3D) shapes or geometries of the substrate base 110 are, but not limited to, square, rectangular, cubical or circular. The substrate 100 is porous and may be made from either metallic or nonmetallic materials. In a preferable embodiment of the present, the substrate material is selected from a group consisting of silicon, molybdenum, tungsten, titanium, silicon carbide, beryllium oxide, nickel, platinum, cobalt, iridium and iron, and combinations thereof. More preferably, the porous substrate material is selected from a group consisting of silicon, titanium, tungsten, platinum and cobalt, with titanium being the most preferable.

The usage of either titanium or silicon comes down primarily to the price and preference. It is known that titanium is better because it is more malleable and easier to create a 3D porous substrate into any desired shape. Silicon is relatively cheaper however brittle and more difficult to design the 3D substrate using it. Considering a functional significance to the shape of the pores—a circular pore being symmetry may be more suitable for chemical applications, and a rectangular pore makes it much easier to use the final porous 3D diamond for structural applications considering that loads may be distributed on the straight beam. Also, if there exists differently scaled pores, this makes the porous diamond suitable for applications in filtration. The shape of the pores and more precisely shape of the beams connecting the diamond structure also makes a difference in thermal energy management. For example, if the pores are circular, it means that the beams are thin in certain areas and thick in others, which will make a difference in thermal transport as heat is transferred easier through thin sections versus thick sections. If the pores are rectangular, the diamond connecting beams will be of same thickness and hence heat transfer will be consistent.

A specific arrangement, type, size and number of the plurality of pores or recesses 120 are pre-defined and controlled depending on the type and shape of the porous diamond 130 required to be manufactured. Some examples of various shapes of the plurality of pores 120 include, but are not limited to, circular, oval, square or star shaped. The pores or recesses 120 of the substrate 100 can be defined from nanoscale to microscale, and also to macroscale. Preferably, the size of the pores 120 are within ranges of 1 nm to 4000 nm, 5 nm to 400 nm and from 10 nm to 100 nm.

In an embodiment of the present invention, a method of depositing or growing diamond on the porous substrate 100 is as described below. Methane (CH4) and hydrogen (H2) are fed through a gas inlet, and into a hot filament (at 2400 K) wherein owing to the reaction, hydrogen molecules (H+H) are activated. This activated hydrogen then reacts with the methane (CH4) and abstracts one of the hydrogen molecules from methane, leaving CH3. Eventually, the reactions are iterated or happen in a cycle—and at the end of the reactions, methane is left with an activated carbon atom which then deposits on the substrate surfaces and reacts to form a diamond film or layer on the substrate 100. This is the first step in the proposed porous diamond manufacturing process.

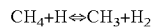

$CH_4+H \Leftrightarrow CH_3+H_2$

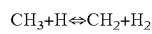

$CH_3+H \Leftrightarrow CH_2+H_2$

$CH_2+H \Leftrightarrow CH+H_2$

$CH+H \Leftrightarrow C$ (activated carbon atom)$+H_2$

In another embodiment of the present invention, the diamond layer deposition or coating process may be performed using conventional methods suitable for the deposition of diamond 130 on a substrate 100. Examples of such coating or deposition processes include, but are not limited to, chemical vapor deposition (CVD), physical vapor deposition (PVD), arc jet based CVD, hot filament CVD (HFCVD), microwave assisted chemical vapor deposition (MWCVD), microplasma, radio frequency plasma chemical vapor deposition (RFPCVD), direct current plasma chemical vapor deposition (DC-PCVD), electron cyclotron resonance (ECR), plasma CVD (ECR-PCVD), combustion flame CVD and epitaxy deposition. Considering chemical vapor deposition (CVD), the process is preferably performed at a pressure ranging from 10 to 100 Torr (1 Torr=133.322 Pascal), at a temperature ranging from 300 to 1500° C.—preferably from 700 to 1300° C. In another embodiment of the present invention, a hydrocarbon gas such as methane ($CH_4$) or acetylene ($C_2H_2$) is used as a source or precursor for depositing and growth of diamond layer 130. The injection of hydrocarbon gas is preferably performed using a mixture of said hydrocarbon gas with hydrogen gas. The preferred ratio of said gas mixture is from 1% to 10% of the hydrocarbon gas with respect to hydrogen gas. By injecting more than 10% of hydrocarbon gas, defects may be created in the diamond during its formation.

The deposition of the carbon atom is done on the substrate 100 (to form a diamond layer) in a manner such that the plurality of pores 120 (recesses/through-holes) present on the substrate 100 are not filled up with diamond depositions—and instead the diamond layer is formed on every beam, corner, recess, and every other area of the substrate being used for deposition. Accordingly, the diamond layers formed or deposited on the substrate 100 result in the final diamond structure 130 formed to have the same shape, size and number of pores as that of the substrate 100 used for deposition. FIG. 2A shows the diamond layer 130 having a porous surface, and FIG. 1A shows the porous surface of the substrate 100. As a second step in the proposed porous diamond manufacturing process—once the required thickness of the diamond layer to be deposited is achieved on the substrate 100, the substrate 100 is removed or etched away—leaving only the diamond structure in place. This diamond structure is the final pure solid-state three-dimensional (3D) porous diamond structure in accordance with the present invention (as shown in FIG. 2B).

FIG. 1B shows a substrate 100 having a base 110 with specific porosity or a plurality of pores or recesses 120 is used to deposit and grow diamond films with a controlled thickness. FIG. 2B is the final pure solid-state three-dimensional (3D) porous diamond structure 130 in accordance with the present invention—which is an exact replica of the substrate used—in terms of shape, size and number of pores/recesses 120. The proposed method allows the final diamond structure 130 to have the same shape, size and number of pores (or recesses/through-holes) as that of the used (and subsequently removed) deposition substrate 100.

In a preferable embodiment of the present invention, two levels of porosity are achieved on the final diamond structure 130 using the proposed method of carbon deposition. A first level of pores are formed from the plurality of pores 120 originally present on the substrate 100 used for carbon deposition, and a second level of pores or gaps are formed subsequent to the removal of the substrate 100 (via methods such as acid etching) from the deposited diamond structure 130. Accordingly, a porous 3D diamond structure 130 is formed with the two levels of porosity, and a replica of the particular substrate 100 used for deposition is formed out of diamond with all its pores intact (an including an additional set of pores or gaps as well). Accordingly, a porous tri-dimensional diamond structure is formed with the two levels of porosity. A replica of the particular substrate used is formed out of diamond—with all its pores intact (and including an additional set of pores or gaps as well).

By adjusting the parameters and conditions of the CVD process, a tridimensional synthetic porous diamond 130 is formed having a controlled thickness and porosity. During the deposition and growth of the diamond 130, the porosity or number of pores of the formed diamond 130 adopts the same geometry and shape of the plurality of pores 120 of the substrate 100. This is very advantageous since it is easier to manufacture a porous diamond with a controlled thickness and porosity by simply choosing the porous substrate 100 to be used. FIG. 3 shows a number of various substrates used for obtaining diamond structures of the same shape, size and pores as that of the substrates used.

As mentioned previously—the second step of the process of the present invention is the removal of the porous substrate 100. When depositing the activated carbon atom over the substrate 100, at least one area or corner of the substrate 100 is left open or untouched (diamond is not allowed to deposit on the at least one area or corner of the substrate 100), or such that the at least one area or corner of the substrate 100 does not make contact with the activated carbon atom, for allowing the substrate to be subsequently removed from the diamond structure formed during the final stage of the 3D diamond manufacturing process. The said porous substrate 100 is removed or etched out via several methods including, but not limiting to, thermal decomposition, oxidative decomposition, acidic etching or basic etching. As illustrated in FIG. 2A and FIG. 2B, the final product is a synthetic porous diamond 130 having the same shape, size and geometry of the pores 120 of the substrate 100 but without being coated to the substrate 100 (considering that the substrate 100 is removed at the final stage of manufacture). In another embodiment, the substrate 100 is also removed or eliminated via the plurality of pores on the formed pure solid-state three-dimensional (3D) porous diamond structure 130.

Preferably, the substrate 100 is removed by immersing the unit into a chemical solution for at least 2 hours. The removal process of the substrate 100 of the present invention can be performed at a temperature ranging from room temperature (27° C.) to a temperature below the boiling point of the solution. Preferably at a temperature ranging from 30° C. to the temperature below the boiling point of the solution, more preferably at a temperature ranging from 50° C. to 85° C. Within this range of temperature, the removal process of the substrate 100 is accelerated and therefore the process time decreases drastically. In another embodiment of the present invention, the chemical solution used during the removal process of the substrate 100 is an aqueous acidic chemical solution. Preferably, the chemical solution is a hydrogen chloride solution or a sulphuric acid solution. The concentration of the acidic solution used in the present invention should preferably be higher. Using higher concentration of acidic solution also help to accelerate the process of the removal of the substrate 100. The concentration of the aqueous acidic solution is preferably in the range of 1 to 10M, more preferably in the range of 5 to 10 M. In another embodiment, the pure 3D porous diamond 130 obtained is washed with water to remove any excess of the chemical solution and/or substrate residue. The 3D pure porous diamond structure formed is of a controlled thickness and porosity, and devoid of the substrate.

In another embodiment of the present invention, the removal step is repeated one or more times, preferably two or three times to ensure the complete removal of the substrate 100 and any residues generated from the removal step. The 3D porous diamond 130 is then washed with water, preferably distilled water, before repeating the removal process of the substrate 100. The obtained pure porous diamond according to the process of the present invention is a porous diamond product with a controlled thickness and size. The size of the pure diamond 130 can be in the range of 1 cm to 10 cm. The manufactured product is a pure porous diamond 130 free of any substrate 100. The final product is large size porous diamond 130 with many desirable properties.

The process of the present invention is used to obtain a void at micro level which cannot be seen by eyes or also to create voids at macro level which are visible to the eyes. The substrate 100 used to deposit the diamond films 130 is then eliminated—leaving a pure porous diamond 130 with air inside the pores resulting from the process. The process according to the present invention can obtain synthetic porous diamond 130 in a solid state of dimensions of up to 10 cm. The method of the present invention is capable of producing a solid-state 3D structure diamond 130 with any desired porosity (recesses/through-holes). The produced synthetic porous diamond 130 takes the form and the porosity 120 of the substrate 100 used. The manufactured porous diamond 130 exhibits superior mechanical strength and thus is suitable for many applications.

In an embodiment, the 3D pure diamond 130 obtained according to the process of the present invention is used to enhance and reinforce material and final structures, for example, in the fabrication of microelectronic structures that should be robust enough for packaging and transportation, or for structural application skeleton to reinforce other materials, such as plastics. The enhanced mechanical, thermal, electrical, acoustic properties of 3D porous diamond 130 manufactured according to the present invention offers a wide range of applications, such as shock and impact energy absorbers, dust and fluid filters, engine exhaust mufflers, porous electrodes, high temperature gaskets, heaters, heat exchangers, catalyst supports, construction materials and biomaterials. The final porous diamond structure formed has high thermal conductivity, high mechanical strength and modulus and high optical clarity. Applications for the formed porous tri-dimensional diamond structure includes but is not limited to jewelry, structural applications (such as in cars, vehicle parts, bikes or airplanes), sporting applications and electrical equipment. Porosity in solid materials (diamonds) or substrates increase performance and range of applications for the solid materials (diamonds) or substrates—low density leading to a light weight, and large surface area for storing molecules (liquids or gases) in the pores.

While the invention has been made described in details and with reference to specific embodiments thereof, it will be apparent to one skilled in the art that various additions, omissions, and modifications can be made without departing from the spirit and scope thereof. In particular, although the description has specified certain steps and materials that may be used in the method of the present invention, those skilled in the art will appreciate that many modifications and substitutions may be made. Accordingly it intended that all such modifications, alterations, substitutions and additions be considered to fall within the spirit and scope of the invention. Many changes, modifications, variations and other uses and applications of the subject invention will become apparent to those skilled in the art after considering this specification and the accompanying drawings, which disclose the alternate embodiments thereof. All such changes, modifications, variations and other uses and applications, which do not depart from the spirit and scope of the invention, are deemed to be covered by the invention, which is to be limited only by the claims which follow.

The invention claimed is:

1. A process of manufacturing a tri-dimensional (3D) pure porous diamond structure, the process comprising the steps of:
   a) using a substrate with a pre-defined shape and a plurality of pores or recesses of a defined porosity shape and size;
   b) heating a reactant hydrocarbon gas and reactant hydrogen in a filament, wherein the reactant hydrocarbon gas and reactant hydrogen react to form a product gas;
   c) depositing an activated carbon atom from the product gas onto the substrate, wherein the activated carbon atom reacts with the substrate to form a diamond structure on the substrate; and
   d) removing the substrate to obtain the 3D pure porous diamond structure, wherein the 3D pure porous diamond structure is formed entirely of diamond and is identical in shape and porosity shape and size of the plurality of pores or recesses as that of the substrate.

2. The process of claim 1, wherein the reactant hydrocarbon gas is methane ($CH_4$).

3. The process of claim 1, wherein the reactant hydrocarbon gas is acetylene ($C_2H_2$).

4. The process of claim 1, wherein the 3D pure porous diamond structure comprises two levels of porosity, a first level of pores formed by replicating the plurality of pores of the substrate, and a second level of pores or gaps formed owing to removal of the substrate from the deposited diamond structure.

5. The process of claim 1, wherein deposition of the activated carbon atom is done on the substrate such that the plurality of pores or recesses present on the substrate are not filled up with diamond depositions, thereby allowing the 3D pure porous diamond structure formed to have a same shape, size and number of pores as that of the substrate.

6. The process of claim 1, wherein diamond deposition is avoided to occur at least one corner of the substrate, for allowing the substrate to be removed via the at least one corner.

7. The process of claim 1, wherein the substrate is removed via the plurality of pores formed in the 3D pure porous diamond structure.

8. The process of claim 1, wherein the activated carbon atom is deposited on the substrate using chemical vapor deposition (CVD).

9. The process of claim 1, wherein the substrate material is selected from the group consisting of silicon, molybdenum, tungsten, titanium, silicon carbide, beryllium oxide, nickel, platinum, cobalt, iridium and iron.

10. The process of claim 1, wherein the substrate is removed using thermal decomposition, oxidative decomposition, acidic etching or basic etching.

11. The process of claim 1, wherein the substrate is removed by immersing the diamond structure on the substrate into a chemical solution for at least 2 hours at room temperature (27° C.).

12. The process of claim 11, wherein the chemical solution is an aqueous acidic solution.

13. The process of claim 12, wherein the aqueous acidic solution is hydrogen chloride solution or sulphuric acid solution.

14. The process of claim 12, wherein a concentration of the aqueous acidic solution is 1 to 10M.

15. The process of claim 11, further comprising a step of repeatedly washing the 3D pure porous diamond structure in water to remove excess chemical solution and/or substrate residue.

16. The process of claim 1, wherein the 3D pure porous diamond structure formed is of a controlled thickness and porosity, and devoid of the substrate.

* * * * *